United States Patent [19]

Dolhert

[11] Patent Number: 5,217,946
[45] Date of Patent: Jun. 8, 1993

[54] TIN-CONTAINING CERAMIC COMPOSITION

[75] Inventor: Leonard E. Dolhert, Clarksville, Md.

[73] Assignee: W. R. Grace & Co.-Conn., New York, N.Y.

[21] Appl. No.: 345,338

[22] Filed: May 1, 1989

[51] Int. Cl.$^5$ .......................................... H01L 39/12
[52] U.S. Cl. ...................................... 505/1; 505/782; 501/123; 252/521
[58] Field of Search ................ 252/518, 521; 501/127, 501/123; 505/1, 775, 776, 782, 784, 785

[56] References Cited

U.S. PATENT DOCUMENTS 4,959,348  9/1990  Higashibata et al. ............... 501/123
5,001,109  3/1991  Spencer .................................. 505/1

FOREIGN PATENT DOCUMENTS 0224229  9/1989  Japan .................................. 505/782

OTHER PUBLICATIONS

"Interaction of High Temperature Superconductors with Conductive Oxides", Greenwald et al., (1989), *Sci. Technol. Thin Film Supercond.*, (Proc. Conf.), Meeting Date, 1988, pp. 193-198.
"Effect of Element Substitution on Superconductivity in Bi-Sr-Ca-Cu-O", Heung et al., *Funtai Oyobi Funmatsu Yakin*, (36) 5, pp. 464-467, (1989), (Jul.), *Journal of the Japan Society* of Powder and Powder Metallurgy.
"Heat Treatment and Dopant Effects on the Superconductivity of Bi-Sr-Ca-Cu-O Ceramics", A. Maddalena, *Journal of Materials Science Letters*, (1989), vol. 8, No. 3, pp. 334-336.
"The Effect of Composition and Processing on High $T_c$ Superconductors Containing Bismuth", Nash et al., *Advances in Powder Metallurgy*, vol. 2, pp. 517-521.
"A Study of Superconductive Oxide Y-Ba-Cu-Sn-O", Xin et al., Int'l. Journal of Modern Physics B, vol. 1, No. 2, (1987), pp. 277-280.
"Ceramic Superconductor Comprising Bismuth Calcium Copper Strontium Oxide Substituted w Tin", (Chem. Abst.), Dec. 11, 1989, Japan Yahigi et al., JP 01305820.
"The Effect of Composition and Processing on High $T_c$ Superconductors Containing Bismuth" Nash et al. Adv. Powder Metall. vol. 2 pp. 517-530.
Bednorz & Muller, Possible High $T_c$ Superconductivity in the Ba-La-Cu-O System, Zeit. Phys. B, 64, 189-193 (1986).
Subramanian et al., A New High Temperature Superconductor, $Bi_2Sr_{3-x}Ca_xCu_2O_{8+y}$, Science, 239, 1015 (1988).
Gao et al., Bulk Superconductivity in $Tl_2CaBa_2Cu_2O_{8+\delta}$, Nature, 332, 623-624 (1988).
Sleight, A. W., Chemistry of High-Temperature Superconductors, Science, 242, 1519 (Dec. 16, 1988).
Mao, X. et al., The Influence of Pb Composition on the Upper Critical Magnetic Field of $Bi_{1.9-x}Pb_xSb_{0.1}Sr_2Ca_2Cu_3O_y$ System (Undated preprint.).
Liu, H. et al., Zero Resistance at 132° K. in the Multiphase System of $Bi_{1.9-x}Pb_xSb_{0.1}Sr_2Ca_2Cu_3O_y$ with X=0.3, 0.4. (Undated preprint.).
Liu, H. et al., Superconducting Transition above 160° K. in Bi-Pb-Sb-Sr-Ca-Cu-O System. (Undated preprint.).
Liu, H. et al., Superconducting Properties in $(Bi_{2-x-y}Pb_xSb_y)Sr_2Ca_2Cu_3O_z$ System (x=0, 0.1, 0.3, 0.5; y=0, 0.1). (Undated preprint.).
Liu, H. et al., The Superconducting Properties in $Bi_{2-x}Sb_xSr_2Ca_2Cu_3O_4$ Compounds (x=0.05, 0.1, 0.15, 0.2), Physica C, 156, 804-806 (1988).
High $T_c$ Update (Nota Bene), Jan. 15, 1989.

Primary Examiner—William R. Dixon, Jr.
Assistant Examiner—Paul Marcantoni
Attorney, Agent, or Firm—Steven Capella

[57] ABSTRACT

Superconductors having a composition $Bi_{2-a-b-c}Sn_aPb_bSb_cSr_2Ca_{n-1}Cu_nO_{2n+4}$ can be made by firing the appropriate mixtures of designated oxides or carbonates. In the composition a=about 0.001–0.4, b about 0–0.4, c about 0–0.4, and n 2 or 3. The addition of Sn improves the superconductive properties of comparable compositions that lack Sn. For example, $Bi_{1.6}Sn_{0.4}Sr_2Ca_2Cu_3O_x$ (x=ca 10), calcined at 830° C. for 15 hours shows superconductivity by magnetic susceptibility tests at about 77° K. whereas $Bi_2Sr_2Ca_2Cu_3O_{10}$ prepared under the same conditions but lacking Sn, shows nothing at this temperature.

6 Claims, 1 Drawing Sheet

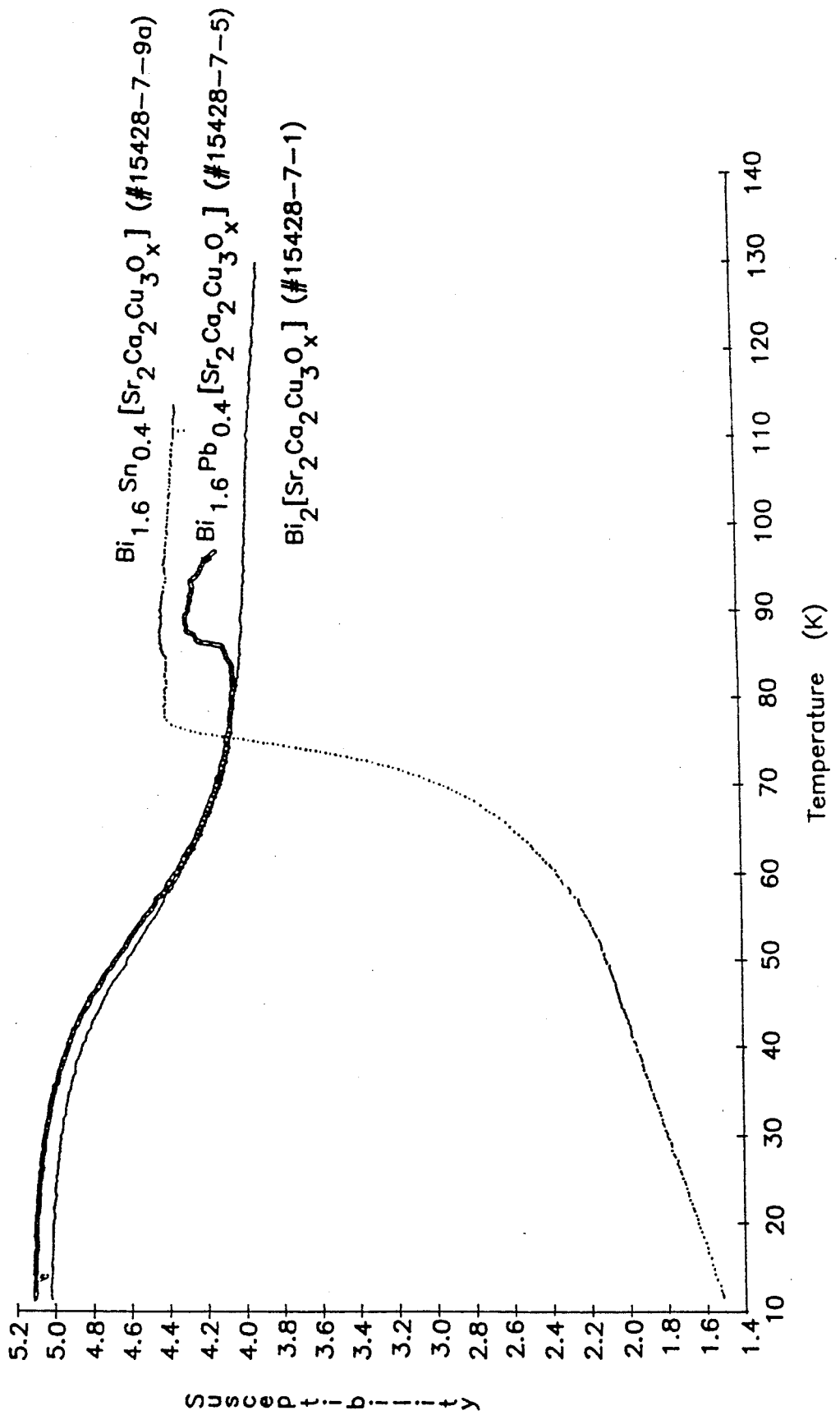

TIN-CONTAINING CERAMIC COMPOSITION

RELATED APPLICATION

U.S. Ser. No. 324,482 filed Mar. 16, 1989, N. D. Spencer, and owned by the same assignee hereof, discloses a ceramic mixed oxide of Bi-Pb-Sb-Sr-Ca-Cu.

FIELD OF THE INVENTION

This invention relates to the preparation of ceramic multi-metal oxides.

BACKGROUND OF THE INVENTION

It has long been known that the effective resistivity of certain metals was sometime substantially eliminated when the metal was exposed to low temperature conditions. Of particular interest were the metals and metal oxides which can conduct electricity under certain low temperature conditions with virtually no resistance. These have become known as superconductors. Certain metals, for example, are known to be superconductive when cooled to about 4° on the Kelvin scale (° K.), and certain niobium alloys are known to be superconductive at about 15° K., some as high as about 23° K.

Discovery of superconductivity in the system La-Ba-Cu-O (J. G. Bednorz and K. A. Muller, *Zeit. Phys. B* 64, 189–193 [1986]) has stimulated the search for other systems, particularly with a view to substituting other elements for the rare earths (RE) used in the earlier materials. For example, replacement of RE by Bi and Tl has been reported. (See M. A. Subramanian et al.,) Science, 239, p. 1015 (1988); L. Gao et al., Nature, 332, pp. 623–624 (1988).

Superconductors of the formula $Bi_2Sr_2Ca_{n-1}Cu_nO_{2n+4}$ where $n=1, 2$, or 3 are known. See Science, 242, 1519 (Dec. 16, 1988). Researchers have replaced some of the Bi with Sb and/or Pb. Thus Bi-Pb-Sb-Sr-Ca-Cu-O superconductors have been made by heating together $Bi_2O_3$, CuO, $SrCO_3$, $CaCO_3$, PbO and $Sb_2O_5$ in air, at, e.g. 830° C. for 15 hours, followed by grinding, pelletizing, sintering at 880° C. for 12 hours, followed by furnace cooling in air. Processes of this type are disclosed in the following preprints:

Mao, X., et al, The Influence of Pb composition on the Upper Critical Magnetic Field of $Bi_{1.9-x}Pb_xSb_{0.1}Sr_2Ca_2Cu_3O_y$ system.

Liu, H. et al, Zero Resistance at 132° K. in the Multiphase System of $Bi_{1.9-x}Pb_xSb_{0.1}Sr_2Ca_2Cu_3O_y$ with $x=0.3, 0.4$.

Liu, H., et al, Superconducting Transition above 160° K. in Bi-Pb-Sr-Ca-Cu-O System.

Liu, H. et al, Superconducting Properties in $(Bi_{2-x-y}Pb_xSb_y)Sr_2Ca_2Cu_3O_z$ System $(x=0, 0.1, 0.3, 0.5; y=0, 0.1)$.

A published article is similar but omits PbO:

Liu et al, The Superconducting Properties in $Bi_{2-x}Sb_xSr_2Ca_2Cu_3O_4$ Compounds $(x=0.05, 0.1, 0.15, 0.2)$ *Physica C* 156, pp. 804–806 (1988).

*High Tc Update*, (Nota Bene), Jan. 15, 1989, describes Bi-Pb-Sb-Sr-Ca-Cu-$O_y$ superconductors.

So far as I have been able to determine, Sn has never before been used in an oxide superconductor.

SUMMARY OF THE INVENTION

The invention is directed to the preparation of novel ceramic oxides of the formula

$$Bi_{2-a-b-c}Sn_aPb_bSb_cSr_2Ca_{n-1}Cu_nO_{2n+4}$$

where $a=$ about 0.001–0.4, $b=$ about 0–0.4, $c=$ about 0–0.4, the sum $a+b+c$ is about 0.001–0.4, and $n=2$ or 3. Suitably, $a=$ about 0.1–0.4, $b=$ about 0.1–0.4, $c=$ about 0.1–0.2, and $(a+b+c)=$ about 0.4–0.5. Typically the new compounds are superconductors, though they may have other uses in the general field of ceramics, e.g., as insulators, glazes, circuit boards, etc.

The new compounds may be regarded as $Bi_2Sr_2Ca_2Cu_3O_x$ $(x=10)$, a known superconductor, in which some of the Bi is replaced with Sn, with or without addition of Pb and/or Sb. The Sn addition improves the superconductivity of the Bi-Sr-Ca-Cu-oxide.

The new compounds can be made by mixing the appropriate oxides or carbonates of the designated metals, followed by compression pelletization, firing, comminution, and repeating the pelletization and firing.

THE FIGURE

The FIGURE provides a comparison of superconducting properties of three Bi-Sr-Ca-Cu containing oxides. The comparison standard is $Bi_2Sr_2Ca_2Cu_3O_x$. In another compound, some of the Bi is replaced with Pb, and in the third (Example 2 below), some of the Bi is replaced with Sn. All products were processed similarly, viz., pellets were tested after firing at 830° C. in air for 15 hours. Magnetic susceptibility of the tin-substituted sample (this invention) clearly has a sharper superconducting transition (sharp downward turn) than the other two samples. The lead-substituted sample has some superconducting phase (note the "blip"), but the non-substituted sample (i.e., Bi only) is not superconducting. On further calcining (865° C., 60 hours) the $Bi_2Sr_2Ca_2Cu_3O_x$ sample showed a small "blip".

DETAILED DESCRIPTION OF THE INVENTION

Sn-containing Bi-Sr-Ca-Cu-oxide can be made using processes available for making $Bi_2Sr_2Ca_2Cu_3O_x$ itself. For example, the appropriate individual oxides or carbonates (as the case may be) are intimately mixed, then pelletized, fired, ground, pelletized, and fired again. As a variant, a portion of the oxide/carbonate mix (cf Example 1) may be initially prepared, then ground with the remaining oxide/carbonate components. Various other processes are available. For example, a solution of nitrates of the metals may be treated with a quaternary ammonium carbonate to precipitate the metals as mixed carbonates, followed by drying the precipitate, and firing. Or the solution of the metal salts (as nitrates, formates, acetates, etc.) may be spray dried, and the product calcined.

The following examples illustrate without limiting the invention.

The type of these starting compounds is not critical provided the compound is calcinable to the oxide. Suitable compounds include oxides, carbonates, bicarbonates, nitrates, mono- and di-carboxylates (formates, acetates, oxalates, etc.), and the like, and mixtures thereof.

EXAMPLE 1

$Sr_2Ca_2Cu_3$-oxygen Base Mixture

For ease of preparing Sn-containing Bi-Sr-Ca-Cu oxides with various amounts of Sn, I have found it convenient first to prepare a mixture of carbonates of Sr and Ca, with Cu oxide, as follows:

After vacuum-drying at 100° C. for 48 hours, a 200 g batch of $SrCO_3$, $CaCO_3$, and $CuO$ in an Sr:Ca:Cu atomic ratio of 2:2:3 was wet-ball milled in a polyurethane-lined jar using zirconia balls for about 5 hours. The resulting mixture was dried in an air oven, sieved (100-mesh sieve) in air, and then the material was stored in a vacuum oven.

The base mixture can be compressed, fired, and ground prior to addition of the other components, but this is not necessary.

When making a given Sn-containing composition of the invention, it is not necessary to start with the base mixture as above described. It is also convenient simply to start with a mixture of $Bi_2O_3$, $SrCO_3$, $CaCO_3$, $CuO$, and $SnO_2$ (or $SnO$), with or without one or more of the other additives herein described, i.e., PbO (or $PbO_2$ or $Pb_3O_4$) and $Sb_2O_3$ (or $Sb_2O_4$ or $Sb_2O_5$). These materials are intimately mixed in amounts to provide atomic ratios of $Bi_{2-a-b-c}Sn_aPb_bSb_cSr_2Ca_{n-1}Cu_nO_{2n+4}$, as explained in the Summary above. Obviously, if b is zero, no Pb is present, and if c is zero, no Sb is present.

The amount of oxygen in the products of this invention will depend on the precise final mixture. In the typical case it is close to theory. Thus, for $Bi_2Sr_2Ca_2Cu_3O_x$, x would calculate theoretically as $(3+2+2+3)=10$, and indeed this particular compound is generally reported with x=10. When Bi is partially replaced by $SnO_2$, additional oxygen is put in the composition. Thus for $Bi_{1.6}Sn_{0.4}Sr_2Ca_2Cu_3O_x$, instead of 3 oxygens for Bi, theory requires $[(1.6/2) \times 3] + (0.4 \times 2) = 3.2$, so that theoretically x=10.2. Similar calculations can be made for the other Sn-modifications of $Bi_2Sr_2Ca_{n-1}Cu_nO_{2n+4}$ herein described.

EXAMPLE 2

| $Bi_{1.6}Sn_{0.4}Sr_2Ca_2Cu_3O_x$; x = ca 10 | |
| --- | --- |
| $Bi_2O_3$ | 6.3882 g. |
| $SnO_2$ | 1.0327 g. |
| $Sr_2Ca_2Cu_3$-oxygen Base Mixture | 12.5792 g. |

The above materials were ground together by mortar and pestle, pressed into pellets (about ⅜″ diameter, about 8 g) at 20,000 psi, and the pellets were fired at about 830° C. for 15 hours in air. The pellets of this first firing showed superconductivity at about 77° K. by magnetic susceptibility tests. (See FIGURE.) The fired pellet was cooled, reground with mortar and pestle, repressed, then refired at about 865° C. in air for 60 hours. The pellet of this second firing showed superconductivity at 115° K. by magnetic susceptibility. The pellet when submerged in liquid nitrogen (77° K.) floated a chip of rare earth magnet, demonstrating superconductivity by the Meissner effect.

EXAMPLE 3

| $Bi_{1.5}Pb_{0.4}Sn_{0.1}Sr_2Ca_2Cu_3O_x$; x = ca 10 | |
| --- | --- |
| $Bi_2O_3$ | 5.8840 g. |
| PbO | 1.5030 g. |
| $SnO_2$ | 0.2535 g. |
| $Sr_2Ca_2Cu_3$-oxygen Base Mixture | 12.3591 g. |

The above materials were mixed and processed as in Example 2. The pellet of the first firing showed a $T_c$ of 74° K. by magnetic susceptibility; the pellet of the second firing when immersed in liquid nitrogen floated a small rare earth magnet, indicating superconductivity by the Meissner effect (at 77° K.).

EXAMPLE 4

| $Bi_{1.5}Pb_{0.3}Sn_{0.1}Sb_{0.1}Sr_2Ca_2Cu_3O_x$; x = ca 10 | |
| --- | --- |
| $Bi_2O_3$ | 5.9224 g. |
| PbO | 1.1348 g. |
| $SnO_2$ | 0.2552 g. |
| $Sb_2O_3$ | 0.2467 g. |
| $Sr_2Ca_2Cu_3$-oxygen Base Mixture | 12.4407 g. |

The above materials were mixed and processed as in Example 2. the pellet of the first firing showed "blips" in magnetic susceptibility at 85° K. and at 77° K. indicating superconductivity. The pellet of the second firing when immersed in liquid nitrogen floated a small rare earth magnet.

EXAMPLE 5

| $Bi_{1.6}Sb_{0.2}Sn_{0.2}Sr_2Ca_2Cu_3O_x$; x = ca 10 | |
| --- | --- |
| $Bi_2O_3$ | 6.3921 g. |
| $Sb_2O_3$ | 0.4998 g. |
| $SnO_2$ | 0.5168 g. |
| $Sr_2Ca_2Cu_3$-oxygen Base Mixture | 12.5897 g. |

The above materials were mixed and processed as in Example 2. The pellet of the first firing showed "blips" in magnetic susceptibility indicating superconductivity at 86° K. and at 78° K. The pellet of the second firing when immersed in liquid nitrogen floated a small rare earth magnet.

FIRING CYCLE

The two-step firing cycle described here provides good uniformity without melting intermediate compounds. The first firing is suitably carried out at about 750°–850° C. for about 5°–20 hours. Following this, the product is cooled, ground, re-pelletized, and fired again. The second firing is suitably at about 850°–880° C. for about 20–70 hours. The second firing may not be required in all instances, but in the general case it improves superconductivity of the product. Grinding and compression are not essential. However, grinding aids uniformity, and compression helps the components react as well as keeps the powder together for testing or other shaping.

In summary, all of the Sn-containing invention compounds (Examples 2-5), as a result of the first firing, showed superconductivity by magnetic susceptibility measurements, but none floated a magnet. All the invention pellets of the second firing floated a magnet (Meissner effect).

In tests carried out so far, use of Sn in accordance with the invention gave results in some respect superior to results when Sn is omitted, other things being equal. (See FIGURE, and discussion, above.) For example, all of the Bi-Sr-Ca-Cu-oxides that lacked Sn showed little or no superconductivity by magnetic susceptibility after firing at 830° C. for 15 hours, whereas all comparable Sn-containing Bi-Sr-Ca-Cu-oxides showed superconductivity (where there was none in the Sn-lacking materials), or improved superconductivity (if there was any in the Sn-lacking materials). Where the Sn-lacking material(s) did show some superconductivity (always faint), addition of Sn to the composition enhanced the indications, as shown by magnetic susceptibility tests.

The Sn-lacking Bi-Sr-Ca-Cu-oxides tested included $Bi_2Sr_2Ca_2Cu_3O_{10}$; $Bi_{1.6}Pb_{0.4}Sr_2Ca_2Cu_3O_x$; $Bi_{1.6}Sb_{0.4}Sr_2Ca_2Cu_3O_x$; and $Bi_{1.5}Pb_{0.4}Sb_{0.1}Sr_2Ca_2Cu_3O_x$.

The Table summarizes relevant test data.

TABLE

Replacement of Bi in $Bi_2[A]$
$[A] = Sr_2Ca_2Cu_3O_x$, x = ca 10

| Compound | AC Susceptibility[1] After First Heat Treatment (830° C., 15 hours) |
| --- | --- |
| $Bi_2[A]$ | no superconductivity |
| $Sn[A]$ | no superconductivity |
| $Bi_{1.6}Pb_{0.4}[A]$[2] | Blip at 86° K. |
| $Bi_{1.6}Sb_{0.4}[A]$[2] | Blip at 77° K. |
| $Bi_{1.6}Sn_{0.4}[A]$[2] | Big drop at 77° K. |
| $Bi_{1.5}Pb_{0.4}Sb_{0.1}[A]$[3] | Big blip at 77° K. |

TABLE-continued

Replacement of Bi in $Bi_2[A]$
$[A] = Sr_2Ca_2Cu_3O_x$, x = ca 10

| Compound | AC Susceptibility[1] After First Heat Treatment (830° C., 15 hours) |
| --- | --- |
| $Bi_{1.5}Pb_{0.4}Sn_{0.1}[A]$[3] | Big drop at 74° K. |

[1]As a sample is cooled and becomes superconducting, the AC magnetic susceptibility drops. Larger drops indicate more of the sample is superconducting. Small drops ("blips") indicate less of the sample is superconducting.
[2]Lead and antimony help, but adding tin is better.
[3]Antimony helps, but tin is better.

I claim:

1. A superconductor composition $Bi_{2-a-b-c}Sn_aPb_bSb_cSr_2Ca_2Cu_3O_x$ where a=about 0.001–0.4, b=about 0–0.4, c=about 0–0.4, a+b+c=about 0.4–0.5 and x=about 10.

2. Composition according to claim 1 wherein a=about 0.1–0.4, b=about 0.1–0.4, and c=about 0.1–0.2.

3. Composition according to claim 2, $Bi_{1.6}Sn_{0.4}Sr_2Ca_2Cu_3O_x$.

4. Composition according to claim 2, $Bi_{1.5}Pb_{0.4}Sn_{0.1}Sr_2Ca_2Cu_3O_x$.

5. Composition according to claim 2, $Bi_{1.5}Pb_{0.3}Sn_{0.1}Sb_{0.1}Sr_2Ca_2Cu_3O_x$.

6. Composition according to claim 2, $Bi_{1.6}Sb_{0.2}Sn_{0.2}Sr_2Ca_2Cu_3O_x$.

* * * * *